(12) United States Patent
Besse et al.

(10) Patent No.: US 9,722,419 B2
(45) Date of Patent: Aug. 1, 2017

(54) ELECTROSTATIC DISCHARGE PROTECTION

(71) Applicants: Patrice Besse, Tournefeuille (FR); Philippe Givelin, Leguevin (FR); Jean Philippe Laine, Saint Lys (FR)

(72) Inventors: Patrice Besse, Tournefeuille (FR); Philippe Givelin, Leguevin (FR); Jean Philippe Laine, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 147 days.

(21) Appl. No.: 14/702,804

(22) Filed: May 4, 2015

(65) Prior Publication Data

US 2016/0156180 A1 Jun. 2, 2016

(30) Foreign Application Priority Data

Dec. 2, 2014 (WO) .................. PCT/IP2014/002912

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
USPC ........................................................ 361/56
See application file for complete search history.

(56) References Cited

U.S. PATENT DOCUMENTS

| | | | | |
|---|---|---|---|---|
| 4,484,244 A * | 11/1984 | Avery | ................ | H01L 27/0248 361/111 |
| 4,633,283 A * | 12/1986 | Avery | ................ | H01L 27/0248 257/122 |
| 5,574,618 A * | 11/1996 | Croft | ................... | H01L 27/0251 361/118 |
| 8,294,422 B2 * | 10/2012 | Tsumura | ............... | H01M 2/348 320/116 |

(Continued)

FOREIGN PATENT DOCUMENTS

| | | |
|---|---|---|
| WO | 2013108065 A1 | 7/2013 |
| WO | 2014041388 A1 | 3/2014 |

OTHER PUBLICATIONS

LTC6803-1/LTC6803-3, Linear Technology, Multicell Battery Stack Monitor, 2011, downloaded from <<http://cds.linear.com/docs/en/datasheet/680313fa.pdf>> on Apr. 27, 2015, 40 pages.

*Primary Examiner* — Scott Bauer
(74) *Attorney, Agent, or Firm* — Charlene R. Jacobsen

(57) ABSTRACT

An electrostatic discharge protection circuit comprises at least two electrostatic discharge protection units connected in series between respective pairs of at least three input terminals, one of the input terminals being a reference input terminal. Each of the units comprises a silicon controlled rectifier and a current mirror. The output of the silicon controlled rectifier constitutes a first output of the respective unit and is connected to an input terminal of the circuit. The output of the current mirror constitutes a second output of the respective unit and is connected with the reference input terminal of the circuit. Thus the units are connected in series but the output terminals of the current mirrors are all connected with the reference input terminal, which may be a ground terminal, so as to minimize the breakdown resistance of the circuit.

20 Claims, 4 Drawing Sheets

(56) References Cited

U.S. PATENT DOCUMENTS

| | | |
|---|---|---|
| 2005/0045909 A1 | 3/2005 | Zhang |
| 2007/0058307 A1* | 3/2007 | Mergens ............ H01L 29/7436 361/56 |
| 2008/0316659 A1 | 12/2008 | Oguzman et al. |
| 2011/0058293 A1 | 3/2011 | Pardoen et al. |
| 2012/0007649 A1* | 1/2012 | Rankin .................. G05F 3/265 327/328 |
| 2013/0285196 A1 | 10/2013 | Dissegna et al. |

* cited by examiner

ELECTROSTATIC DISCHARGE PROTECTION

CROSS REFERENCE TO RELATED APPLICATION(S)

The present application claims priority to International Patent Application No. PCT/IB2014/002912, entitled "ELECTROSTATIC DISCHARGE PROTECTION," filed on Dec. 2, 2014, the entirety of which is herein incorporated by reference.

FIELD OF THE INVENTION

This invention relates to electrostatic discharge (ESD) protection in semiconductor devices. More in particular, this invention relates to electrostatic discharge protection involving multiple voltages.

BACKGROUND OF THE INVENTION

An electrostatic discharge (ESD) is an undesired electric discharge that can occur between two conductors, such as two pins of a semiconductor device. Typically, such a discharge can cause immediate and permanent damage to an electronic circuit. In order to mitigate the effects of electrostatic discharges, ESD protection circuits are often incorporated in electronic circuits. An example of an ESD protection circuit is provided by United States Patent Application publication US 2011058293, which is designed for sensing ESD currents of parallel pins and to switch off the semiconductor device when the ESD current exceeds a threshold value.

International patent application publication WO 2014/041388 also discloses in FIG. 4a a semiconductor device provided with an electrostatic discharge protection (ESD) protection device. This ESD protection device comprises a PNP-NPN transistor pair which together constitute a silicon controlled rectifier (SCR). A further PNP transistor and the PNP transistor of the SCR together constitute a current mirror. Both the SCR and the further transistor are connected to ground. Such an ESD protection device has a single breakdown voltage. The ESD protection comprises a current mirror and two SCRs connected in series. This ESD protection device also has a single, but higher, breakdown voltage.

For certain applications, such as battery monitoring and control applications, multiple cumulative voltages should be protected. For instance, a stack of batteries may be protected using a stack of ESD protection devices, as disclosed in U.S. Pat. No. 8,294,422, for example. A serious disadvantage of such a stack of ESD devices is that their series resistance at breakdown adds up. That is, at breakdown the series resistance of the stack of ESD devices is the sum of the breakdown resistances of the individual devices. When using four or five ESD protection devices in series, this overall resistance may limit the effectiveness of the ESD protection devices. A possible solution is to increase the size of the ESD components to reduce their resistance. However, in integrated circuits such an enlargement of components is often undesirable due to the limited dimensions of the integrated circuit.

SUMMARY OF THE INVENTION

The present invention provides an electrostatic discharge protection circuit, an integrated circuit and a battery assembly as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the figures, elements which correspond to elements already described may have the same reference numerals.

DETAILED DESCRIPTION OF THE PREFERRED EMBODIMENTS

In the following, for sake of understanding, the circuitry is described in operation. However, it will be apparent that the respective elements are arranged to perform the functions being described as performed by them.

Figure 1:
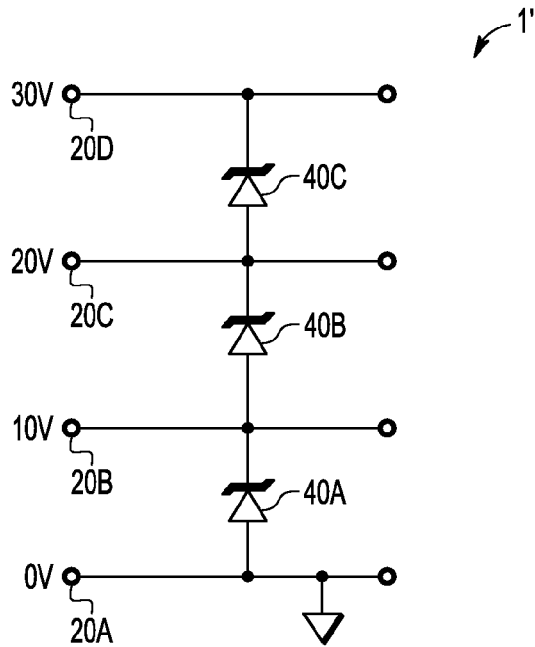
FIG. 1 schematically shows an example of an electrostatic discharge protection circuit according to the prior art.

The prior art electrostatic discharge (ESD) protection circuit 1' shown in FIG. 1 comprises a plurality of input terminals 20 to which different voltages may be applied. In the example of FIG. 1, the circuit 1' comprises four input terminals 20A-20D between which three ESD protection elements 40A-40C are arranged in series, each ESD protection element 40 being connected to two input terminals 20. Input terminal 20A may serve as a reference terminal and be connected to a reference voltage, for example ground.

In the prior art arrangement of FIG. 1, the ESD protection elements 40 are constituted by Zener diodes. As is well known, Zener diodes have a reverse breakdown voltage, also known as Zener voltage, at which the current through the diode is virtually independent of the voltage. So once the Zener voltage is exceeded, the diode will conduct, but below the Zener voltage the diode will not conduct, or at least have a high impedance. Assuming that the Zener diodes of FIG. 1 have a Zener voltage of 10 V, then input terminal 20B will be able to neutralize voltages exceeding 10 V but pass input voltages below 10 V (it is noted that in the present example input terminal 20A is connected to ground and therefore is assumed to have a voltage of 0 V).

When, in the example of FIG. 1, an overvoltage (possibly caused by an ESD) of more than 30 V occurs, then all three Zener diodes 40A-40C will start conducting. However, each conducting Zener diode has a certain resistance and the resistances of the three Zener diode add up to form a total resistance which is three times the individual Zener resistance. It will be understood that the resistance of the series arrangement increases linearly with the number of Zener diodes, and will be even greater when for example five Zener diodes are arranged in series. This is a serious drawback in many applications, as the combined resistance will cause a non-negligible voltage drop over the ESD protection device, even when it is conducting. This, in turn, may leave an ESD voltage at an input terminal which is high enough to cause damage to electronic components that the ESD protection circuit was meant to protect.

Figure 2:
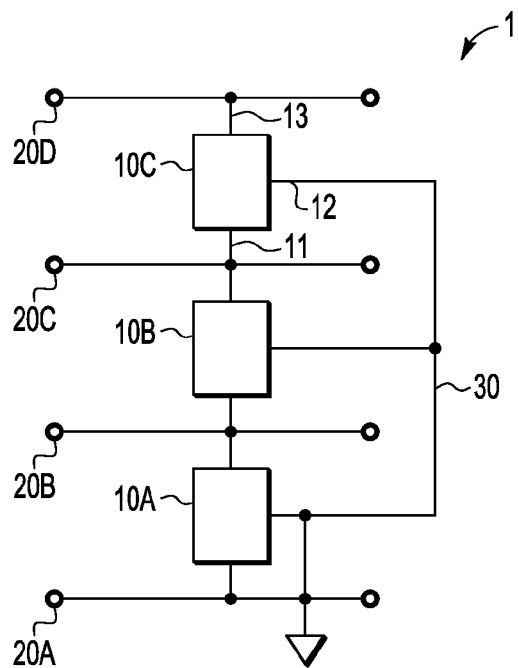
FIG. 2 schematically shows an example of an embodiment of an electrostatic discharge protection circuit.

The example of a electrostatic discharge protection circuit 1 which is shown in FIG. 2 also comprises a plurality of input terminals 20 to which different voltages may be applied. In the example of FIG. 2, the circuit 1 comprises four input terminals 20A-20D between which three ESD protection units 10A-10C are arranged in series, each ESD protection unit 10 being connected to two input terminals 20. As in FIG. 1, input terminal 20A may serve as a reference terminal and be connected to a reference voltage, for example ground, although it could also be connected to another reference voltage, for example a negative supply voltage.

In the example of FIG. 2, the ESD protection units 10 are not constituted by a Zener diode, or at least not by a single Zener diode. The ESD protection units 10 have an input 13 and a first output 11, both connected to an input terminal. In the example shown, the input 13 of ESD protection unit 10C is shown to be connected to input terminal 20D, while first output 11 is shown to be connected to input terminal 20C. In contrast with the arrangement of FIG. 1, the ESD protection units of FIG. 2 additionally have a second output 12 which is connected, via a common conductor 30, with the reference terminal 20A and hence, in the example shown, with ground. That is, each ESD protection unit 10 is provided with an additional output which is connected with the reference terminal. Although the common conductor 30 could comprise an impedance, such as a resistor, it is preferred that the common conductor 30 has a resistance which is as small as possible, such that the second outputs 12 of the ESD protection units 10 can be said to be directly connected with the reference terminal 20A, whereas the presence of a resistor, or any other element between the second outputs 12 and the reference terminal 20A, would constitute an indirect connection.

By providing a common conductor 30 for connecting an output of each ESD protection unit with the reference input terminal (that is, ground in the present example), the detrimental effects of the series connection of ESD protection units is eliminated as the series resistances no longer add up. As a result, a large number of ESD protection units may be connected in series while still having a very low breakthrough resistance.

The additional output 12 of the ESD protection units 10 may be supplied in various ways. In an embodiment, schematically illustrated in FIG. 3A, the additional or second output 12 is provided by a current mirror (CM) formed by two transistors T1 and T3. In the example shown, the transistors of the current mirror are PNP type transistors, but those skilled in the art will recognize that, with appropriate polarity adaptations, NPN type transistors may also be used.

Figure 3A:
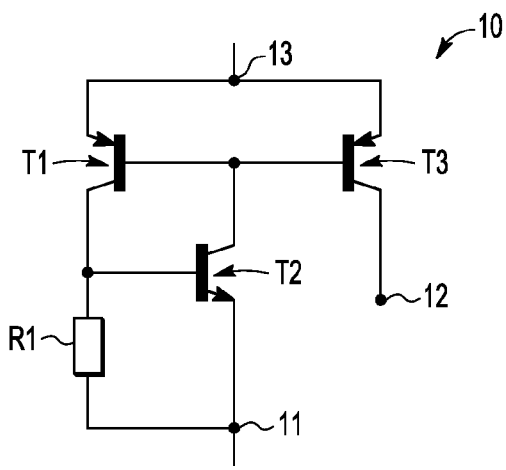
FIGS. 3A-C schematically show examples of part of an embodiment of an electrostatic discharge protection circuit in more detail.

In the embodiment of FIG. 3A, the Zener clamp is obtained with the aid of transistors T1 and T2, which together form an SCR (silicon controlled rectifier), which is known per se and is also known as a thyristor. It is possible to replace the transistor T2 with another component, such as a Zener diode (as will be explained below with reference to FIG. 3B). However, in the embodiment of FIG. 3A the Zener clamp is achieved by the base-collector junction of the first transistor T1. Once transistor T1 starts conducting, transistor T3 will start conducting as well, carrying the same current if the transistors T1 and T3 have the same dimensions.

The example of FIG. 3A is provided with a resistor R1 arranged between the base and the emitter of NPN transistor T2 to provide a suitable base voltage when the transistor is conducting. In order not to limit the current through the unit 10, the value of the resistor R1 may be chosen to be low, and may in some embodiments be close to zero.

Figure 3B:
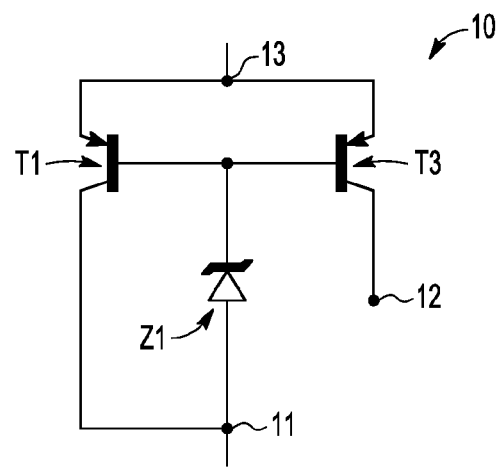

An alternative embodiment of an ESD protection unit 10 is illustrated in FIG. 3B, where the transistor T2 is replaced with a Zener diode Z1 which connected between the base of the transistors T1 and T3 and the first output 11. In this embodiment, the resistor R1 may be omitted.

Figure 3C:
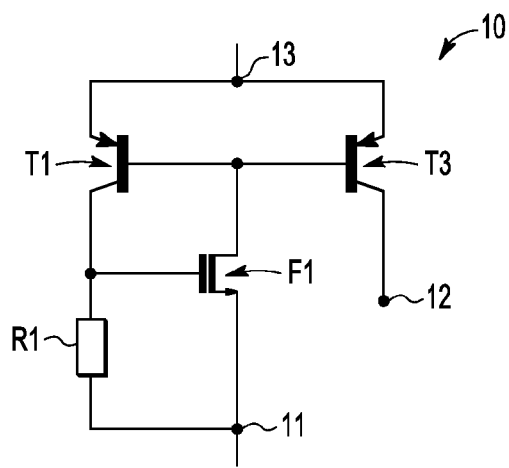

Another alternative embodiment of an ESD protection unit 10 is illustrated in FIG. 3C, where the bipolar transistor T2 is replaced with a FET (Field Effect Transistor) F1. In the embodiment shown, the FET F1 is an N-channel MOSFET but those skilled in the art will appreciate that the invention is not so limited and that with appropriate polarity adaptations P-channel MOSFETs may also be used, or P-channel JFETs (Junction FETs), for example.

Figure 4:
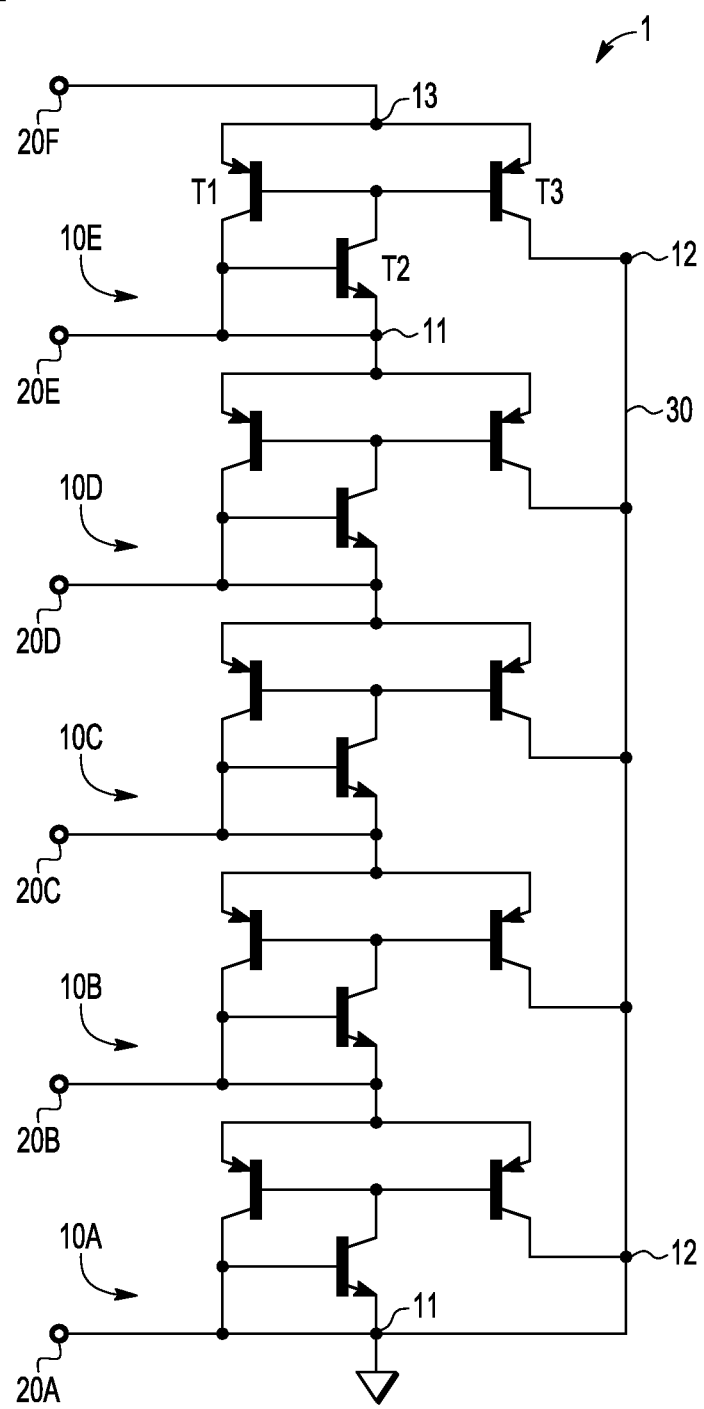
FIG. 4 schematically shows an example of an embodiment of an electrostatic discharge protection circuit in more detail.

An example of an ESD protection circuit 1 suitable for five different voltages plus the reference voltage and therefore comprising five ESD protection units is schematically illustrated in FIG. 4. In the embodiment of FIG. 4, each ESD protection unit comprises a first transistor T1, a second transistor T2 and a third transistor T3, where the transistors T1 and T2 constitute an SCR and the transistors T1 and T3 constitute a current mirror. As can be seen, the collectors of the third transistors T3 are all connected to the common conductor 30, which is also connected to the reference input terminal 20A.

In embodiments of the present invention, such as the embodiment of FIG. 4, the third transistor T3 has a breakdown voltage which may differ from the breakdown voltage of its current mirror counterpart T1. More in particular, the breakdown voltage of the third transistor T3 preferably depends on its position in the ESD protection circuit. In unit 10A, the breakdown voltages of transistors T1 and T3 are chosen to be equal, in the example 10 V, as both outputs 11 and 12 of the unit are connected to ground. In unit 10B, however, transistor T1 has a breakdown voltage of 10 V, while transistor T3 has a breakdown voltage of 20 V. This higher breakdown voltage of T3 in unit 10B allows a voltage surge higher than 20 V to be diverted to ground immediately, without requiring unit 10A to start conducting. Accordingly, the ESD protection circuit reacts quicker and more reliably to overvoltages.

Similarly, transistor T3 of unit 10C has a breakdown voltage of 30 V while transistor T1 of the same unit has a breakdown voltage of 10 V, equal to the breakdown voltages of all transistors T1.

Accordingly, an electrostatic discharge protection circuit 1 is shown to comprise at least two electrostatic discharge protection units 10A-10E connected in series between respective pairs of at least three input terminals 20A-20E, one of the input terminals 20A being a reference input terminal, each of the units comprising a silicon controlled rectifier (SCR) and a current mirror (CM), wherein the silicon controlled rectifier provides a first output 11 of the respective unit and is connected to an input terminal 20A-20E of the circuit, and wherein the current mirror constitutes a second output 12 of the respective unit and is connected with the reference input terminal 20A of the circuit.

Each electrostatic discharge protection unit may comprise:
- a first transistor T1,
- a second transistor T2 connected to the first transistor T1 to form the silicon controlled rectifier, and
- a third transistor T3 connected to the first transistor T1 to form the current mirror.

The silicon controlled rectifier and the current mirror are therefore coupled via the first transistor T1, which is, in the embodiments shown, shared between the SCR and the CM.

In the embodiment shown, the first transistor T1 and the third transistor T3 are bipolar transistors of the PNP type, while second transistor T2 is a bipolar transistor of the NPN type. It will be understood that the invention is not so limited and that other transistor arrangements are possible, examples of which are illustrated in FIGS. 3B and 3C.

In the embodiments shown, the ESD protection circuit comprises five units. It will be understood that the invention is not so limited and that virtually any number of units is possible, for instance two, three, four, or ten units arranged in series.

The reference terminal is preferably arranged at the beginning or the end of the series arrangement, as illustrated in FIGS. 2 and 4. However, this is not essential and embodiments can be envisaged in which the reference terminal is located elsewhere in the series arrangement, for example in the middle. Consequently, the second outputs 12 are also connected, via the common conductor 30, to this more central reference input terminal.

Figure 5:
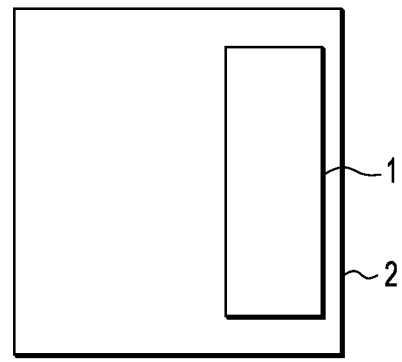
FIG. 5 schematically shows an example of an embodiment of an integrated circuit comprising an electrostatic discharge protection circuit.

The invention further provides an integrated circuit 2, comprising at least one electrostatic discharge protection circuit 1 as described above. Such an integrated circuit 2 is schematically illustrated in FIG. 5. The integrated circuit 2 may further comprise other circuits, such as battery monitoring circuits.

Figure 6:
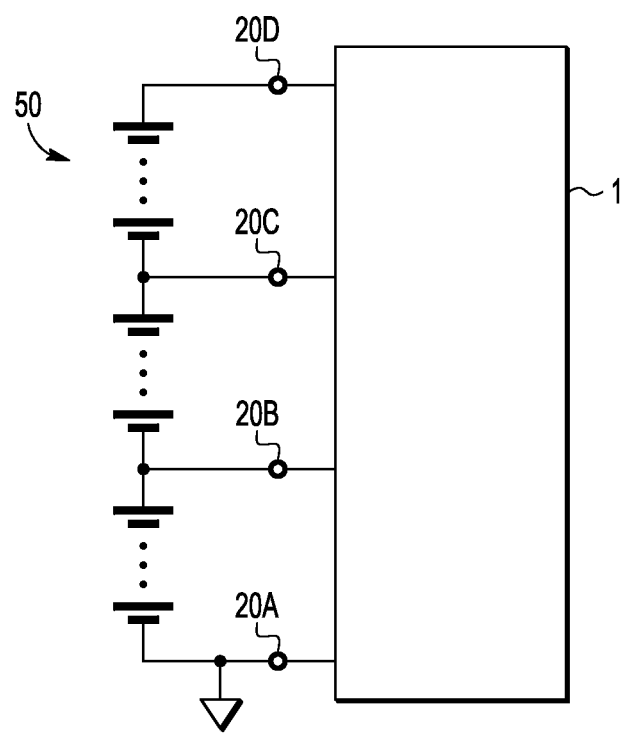
FIG. 6 schematically shows an example of an embodiment of a battery assembly provided with an electrostatic discharge protection circuit.

The invention also provides a battery assembly 50 having multiple outputs for providing multiple voltages, provided with an electrostatic discharge protection circuit 1 as described above. Such a battery assembly is schematically illustrated in FIG. 6. It can be seen in FIG. 6 that the input terminals 20A-20D receive different voltages: input terminal 20D receives the highest voltage, while input terminal 20A is, in this example, connected to ground. Input terminals 20B and 20C each receive a different intermediate voltage. The electrostatic discharge protection circuit 1 is capable of protecting against overvoltages at any of the terminals.

In the foregoing specification, the invention has been described with reference to specific examples of embodiments of the invention. It will, however, be evident that various modifications and changes may be made therein without departing from the scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Devices functionally forming separate devices may be integrated in a single physical device. Also, the units and circuits may be suitably combined in one or more semiconductor devices.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

It will therefore be understood by those skilled in the art that the invention is not limited to the embodiments shown and that many additions and modifications may be made without departing from the scope of the invention as defined in the appending claims.

The invention claimed is:

1. An electrostatic discharge protection circuit, comprising:
   at least three input terminals and at least two electrostatic discharge protection units connected in series between respective pairs of the at least three input terminals,
   the at least three input terminals comprising a reference input terminal;
   each of said electrostatic discharge protection units comprising:
   a silicon controlled rectifier coupled with a current mirror;
   the silicon controlled rectifier providing a first output of the electrostatic discharge protection unit, the first output connected to a respective input terminal of the electrostatic discharge protection circuit, and
   the current mirror providing a second output of the electrostatic discharge protection unit, the second output connected to the reference input terminal.

2. The electrostatic discharge protection circuit according to claim 1, wherein the second output of each unit is directly connected with the reference input terminal.

3. The electrostatic discharge protection circuit according to claim 1, wherein the reference terminal is connected to ground.

4. The electrostatic discharge protection circuit according to claim 1 wherein each unit comprises:
   a first transistor,
   a second transistor connected to the first transistor to form the silicon controlled rectifier, and
   a third transistor connected to the first transistor to form the current mirror.

5. The electrostatic discharge protection circuit according to claim 4, wherein the first transistor and the third transistor are bipolar transistors of the PNP type.

6. The electrostatic discharge protection circuit according to claim 5, wherein the second transistor is a bipolar transistor of the NPN type.

7. The electrostatic discharge protection circuit according to claim 4, wherein the second transistor is a FET transistor of the N-channel type.

8. The electrostatic discharge protection circuit according to claim 4, wherein the third transistor has a breakdown voltage which depends on the position of the respective unit relative to the reference terminal.

9. The electrostatic discharge protection circuit according to claim 1, comprising five units.

10. An integrated circuit, comprising at least one electrostatic discharge protection circuit according to claim 1.

11. A battery assembly having multiple outputs for providing multiple voltages, provided with an electrostatic discharge protection circuit according to claim 1.

12. The electrostatic discharge protection circuit according to claim 1 wherein the first electrostatic discharge protection unit and the second electrostatic discharge protection unit each comprises:
a first transistor;
a second transistor connected to the first transistor to form the respective SCR; and
a third transistor connected to the first transistor to form the respective current mirror.

13. The electrostatic discharge protection circuit according to claim 12, wherein the first transistor and the third transistor are bipolar transistors of the PNP type.

14. The electrostatic discharge protection circuit according to claim 13, wherein the second transistor is a bipolar transistor of the NPN type.

15. The electrostatic discharge protection circuit according to claim 12, wherein the second transistor is a N-channel FET transistor.

16. The electrostatic discharge protection circuit according to claim 12, wherein the third transistor has a breakdown voltage which depends on the position of the respective electrostatic discharge protection unit relative to the reference terminal.

17. The electrostatic discharge protection circuit according to claim 1, wherein the silicon controlled rectifier includes a first transistor and a second transistor, a base of the first transistor connected to the collector of the second transistor, and a base of the second transistor connected to the collector of the first transistor.

18. An electrostatic discharge protection circuit, comprising:
a reference input terminal;
a first input terminal;
a second input terminal;
a first electrostatic discharge protection unit including:
a first silicon controlled rectifier (SCR), a first current electrode of the first SCR coupled to the first input terminal and a second current electrode of the first SCR coupled to the reference input terminal; and
a first current mirror coupled to the first SCR, the first current mirror including an output that is connected to the reference input terminal; and
a second electrostatic discharge protection unit including:
a second SCR, a first current electrode of the second SCR coupled to the second input terminal and a second current electrode of the second SCR coupled to the first input terminal; and
a second current mirror coupled to the second SCR, the second current mirror including an output that is connected to the reference input terminal.

19. The electrostatic discharge protection circuit according to claim 18, wherein the reference input terminal is connected to ground.

20. The electrostatic discharge protection circuit according to claim 18, wherein the first SCR includes a first transistor and a second transistor, a base of the first transistor connected to the collector of the second transistor, and a base of the second transistor connected to the collector of the first transistor.

* * * * *